United States Patent
Cho et al.

(10) Patent No.: US 7,589,028 B1
(45) Date of Patent: Sep. 15, 2009

(54) HYDROXYL BOND REMOVAL AND FILM DENSIFICATION METHOD FOR OXIDE FILMS USING MICROWAVE POST TREATMENT

(75) Inventors: Seon-Mee Cho, San Jose, CA (US); Mike Barnes, San Ramon, CA (US); Michelle Schulberg, Newton, MA (US); George D. Papasouliotis, Sunnyvale, CA (US)

(73) Assignee: Novellus Systems, Inc., San Jose, CA (US)

( * ) Notice: Subject to any disclaimer, the term of this patent is extended or adjusted under 35 U.S.C. 154(b) by 420 days.

(21) Appl. No.: 11/280,076

(22) Filed: Nov. 15, 2005

(51) Int. Cl.
*H01L 21/31* (2006.01)
*H01L 21/461* (2006.01)

(52) U.S. Cl. ............... 438/778; 438/424; 257/E21.576; 427/553

(58) Field of Classification Search ......... 438/761, 438/778, 780–781, 787, 424, 435–437; 427/532, 427/553; 257/E21.57, E21.576
See application file for complete search history.

(56) References Cited

U.S. PATENT DOCUMENTS

| | | | |
|---|---|---|---|
| 5,314,724 A | 5/1994 | Tsukune et al. | |
| 5,525,550 A | 6/1996 | Kato | |
| 5,527,561 A | 6/1996 | Dobson | |
| 5,597,395 A | 1/1997 | Bocko et al. | |
| 5,705,028 A | 1/1998 | Matsumoto | |
| 5,985,770 A | 11/1999 | Sandhu et al. | |
| 6,030,881 A | 2/2000 | Papasouliotis et al. | |
| 6,064,104 A | 5/2000 | Omid-Zohoor et al. | |
| 6,102,993 A | 8/2000 | Bhandari et al. | |
| 6,133,160 A | 10/2000 | Komiyama et al. | |
| 6,184,108 B1 | 2/2001 | Omid-Zohoor et al. | |
| 6,184,143 B1 | 2/2001 | Ohashi et al. | |
| 6,300,219 B1 | 10/2001 | Doan et al. | |
| 6,316,063 B1 | 11/2001 | Andideh et al. | |
| 6,335,261 B1 | 1/2002 | Natzle et al. | |
| 6,352,943 B2 | 3/2002 | Maeda et al. | |
| 6,352,953 B1 | 3/2002 | Seki et al. | |
| 6,372,669 B2 | 4/2002 | Sandhu et al. | |
| 6,503,330 B1 | 1/2003 | Sneh et al. | |
| 6,504,233 B1 | 1/2003 | Gorczyca et al. | |
| 6,511,539 B1 | 1/2003 | Raaijmakers | |

(Continued)

FOREIGN PATENT DOCUMENTS

JP          63076335     *  4/1988

(Continued)

OTHER PUBLICATIONS

U.S. Office Action mailed Feb. 24, 2006, from U.S. Appl. No. 11/077,108.

(Continued)

*Primary Examiner*—Thanhha Pham
(74) *Attorney, Agent, or Firm*—Weaver Austin Villeneuve & Sampson LLP

(57) ABSTRACT

Methods of forming dielectric films with increased density and improved film properties are provided. The methods involve exposing dielectric films to microwave radiation. According to various embodiments, the methods may be used to remove hydroxyl bonds, increase film density, reduce or eliminate seams and voids, and optimize film properties such as dielectric constant, refractive index and stress for particular applications. In certain embodiments, the methods are used to form conformal films deposited by a technique such as PDL. The methods may be used in applications requiring low thermal budgets.

25 Claims, 6 Drawing Sheets

U.S. PATENT DOCUMENTS

| | | | |
|---|---|---|---|
| 6,531,377 | B2 | 3/2003 | Knorr et al. |
| 6,534,395 | B2 | 3/2003 | Werkhoven et al. |
| 6,534,802 | B1 | 3/2003 | Schuegraf |
| 6,540,838 | B2 | 4/2003 | Sneh et al. |
| 6,551,339 | B2 | 4/2003 | Gavronsky |
| 6,551,399 | B1 | 4/2003 | Sneh et al. |
| 6,586,349 | B1 | 7/2003 | Jeon et al. |
| 6,624,091 | B2 | 9/2003 | Yuan |
| 6,780,789 | B1 | 8/2004 | Yu et al. |
| 6,784,101 | B1 | 8/2004 | Yu et al. |
| 6,802,944 | B2 | 10/2004 | Ahmad et al. |
| 6,861,334 | B2 | 3/2005 | Raaijmakers et al. |
| 6,867,152 | B1 | 3/2005 | Hausmann et al. |
| 6,903,005 | B1 | 6/2005 | Marsh |
| 6,908,862 | B2 | 6/2005 | Li et al. |
| 6,949,481 | B1 | 9/2005 | Halliyal et al. |
| 6,984,591 | B1 | 1/2006 | Buchanan et al. |
| 7,097,878 | B1 | 8/2006 | Rulkens et al. |
| 7,129,189 | B1 | 10/2006 | Hausmann et al. |
| 7,148,155 | B1* | 12/2006 | Tarafdar et al. ............ 438/778 |
| 7,163,899 | B1 | 1/2007 | Cho et al. |
| 7,202,185 | B1 | 4/2007 | Hausmann et al. |
| 7,223,707 | B1 | 5/2007 | Papasouliotis et al. |
| 7,297,608 | B1* | 11/2007 | Papasouliotis et al. ...... 438/404 |
| 2001/0049205 | A1 | 12/2001 | Sandhu et al. |
| 2002/0094388 | A1* | 7/2002 | Fonash et al. ............... 427/579 |
| 2003/0015764 | A1 | 1/2003 | Raaijmakers et al. |
| 2003/0092241 | A1 | 5/2003 | Doan et al. |
| 2003/0129828 | A1 | 7/2003 | Cohen et al. |
| 2003/0134741 | A1 | 7/2003 | Weisbeck et al. |
| 2003/0157781 | A1 | 8/2003 | Macneil et al. |
| 2004/0004247 | A1 | 1/2004 | Forbes et al. |
| 2004/0025787 | A1 | 2/2004 | Selbrede et al. |
| 2004/0043149 | A1 | 3/2004 | Gordon et al. |
| 2004/0043569 | A1 | 3/2004 | Ahn et al. |
| 2004/0044127 | A1 | 3/2004 | Okubo et al. |
| 2004/0079728 | A1 | 4/2004 | Mungekar et al. |
| 2004/0102031 | A1 | 5/2004 | Kloster et al. |
| 2004/0203254 | A1 | 10/2004 | Conley et al. |
| 2004/0206267 | A1 | 10/2004 | Sambasivan et al. |
| 2004/0222490 | A1 | 11/2004 | Raaijmakers et al. |
| 2004/0247787 | A1 | 12/2004 | Mackie et al. |
| 2005/0054213 | A1 | 3/2005 | Derderian et al. |
| 2005/0112282 | A1 | 5/2005 | Gordon et al. |
| 2005/0239264 | A1 | 10/2005 | Jin et al. |
| 2005/0271813 | A1 | 12/2005 | Kher et al. |
| 2006/0038293 | A1 | 2/2006 | Rueger et al. |
| 2006/0087000 | A1 | 4/2006 | Okuno |
| 2006/0127578 | A1 | 6/2006 | Lei et al. |
| 2007/0020952 | A1 | 1/2007 | Lin et al. |

FOREIGN PATENT DOCUMENTS

| | | |
|---|---|---|
| JP | 5-308071 A | 11/1993 |
| JP | 2004-256479 | 9/2004 |
| WO | WO02/27063 | 4/2002 |
| WO | WO 03/083167 A1 | 10/2003 |

OTHER PUBLICATIONS

U.S. Office Action mailed Mar. 24, 2006, from U.S. Appl. No. 10/975,028.

U.S. Office Action mailed May 23, 2006, from U.S. Appl. No. 11/077,198.

U.S. Office Action mailed May 24, 2006, from U.S. Appl. No. 11/026,284.

U.S. Office Action mailed May 31, 2006, from U.S. Appl. No. 11/026,563.

U.S. Office Action mailed May 15, 2006, from U.S. Appl. No. 11/027,480.

U.S. Office Action mailed Apr. 25, 2006, from U.S. Appl. No. 11/021,558.

U.S. Office Action mailed May 8, 2006, from U.S. Appl. No. 11/327,668.

"Atomic Layer Deposition of Metal Oxide Thin Films," A thesis presented by Dennis Michael Hausmann, Harvard University, 186 pages, Jul. 2002.

Hausmann et al., "Rapid Vapor Deposition of Highly Conformal Silica Nanolaminates," Science, vol. 308, Oct. 2002, 5 Pages.

Gordon et al., "A Kinetic Model for Step Coverage by Atomic Layer Deposition in Narrow Holes or Trenches", Chemical Vapor Deposition 2003, 9, No. 2, pp. 73-78.

U.S. Office Action mailed May 31, 2005, from U.S. Appl. No. 10/746,274.

Hausmann et al., "Plasma Treatments to Improve the Properties of Silcia Thin Films Produced by a Rapid Vapor Deposition (RVD)", Novellus Systems, Inc., filed Dec. 23, 2000, U.S. Appl. No. 10/746,274, pp. 1-29.

Greer et al., "Method and Apparatus to Reduce the Frequency of Chamber Cleans in Rapid Vapor Deposition (RVD) of Silicon Oxide", Novellus Systems, Inc., filed Jul. 12, 2004, U.S. Appl. No. 10/890,376, pp. 1-25.

Hausmann et al., "Silica Thin Films Produced by Rapid Surface Catalyzed Vapor Deposition (RVD) Using a Nucleation Layer", Novellus Systems, Inc., filed Jun. 22, 2004, U.S. Appl. No. 10/875,158, pp. 1-25.

U.S. Office Action mailed Sep. 22, 2005, from U.S. Appl. No. 10/874,814.

Rulkens et al., "Mixed Alkoxy Precursors and Methods of Their Use for Rapid Vapor Deposition of $SiO_2$ Films", Novellus Systems, Inc., filed Jun. 22, 2004, U.S. Appl. No. 10/874,814, pp. 1-26.

U.S. Office Action mailed Jun. 23, 2005, from U.S. Appl. No. 10/874,808.

Hausmann et al., "Aluminum Phosphate Incorporation in Silica Thin Films Produced by Rapid Surface Catalyzed Vapor Deposition (RVD)", Novellus Systems, Inc., filed Jun. 22, 2004, U.S. Appl. No. 10/874,808, pp. 1-21.

Papsouliotis et al., "Method for Controlling Properties of Conformal Silica Nanolaminates Formed by Rapid Vapor Depostition", Novellus Systems, Inc., filed Jun. 22, 2004, U.S. Appl. No. 10/874,696, pp. 1-30.

Gaillard et al., "Silicon dioxide chemical vapor deposition using silane and hydrogen peroxide", Rapid Communications, J. Vac. Sci. Technol. B 14(4), Jul./Aug. 1996, pp. 2767-2769.

Beekmann, et al., "Properties of posttreated low κ flowfill™ films and their stability after etch, resist and polymer strip processes", Microelectronic Engineering 55(2001), pp. 73-79.

Robl et al., "Integration of Flowfill® and Forcefill® for cost effective via applications" Sep. 1999, pp. 77-83.

Penka et al., "Integration Aspects of Flowfill and Spin-on-Glass Process for Sub-0.35 μm Interconnects", pp. 1-3.

Hockele et al., "Flowfill-Process as a New Concept for Inter-Metal-Dielectrics", Siemens AG, Semiconductor Group, 1998, pp. 235-238.

Roland et al., "Theoretrical Modeling of $SiO_2$ Photochemical Vapor Deposition and Comparison to Experimental Results for Three Oxidant Chemistries: $SiH_4+O_2$, $H_2O/O_2$, and $H_2O_2$ ", Chem Mater 2001, 13, 2501-2510.

Roland et al., "Low Temperature Photochemical Vapor Deposition of SiO2 Using 172 nm Xe2* Excimer Lamp Radiation with Three Oxidant Chemistries: $O_2$, $H_2O/O_2$, and $H_2O_2$", Chem Mater 2001, 13, 2493-2500.

Moore et al., "Reaction of hydrogen peroxide with organosilanes under chemical vapour deposition conditions", J. Chem. Soc., Dalton Trans., 2000, 2673-2677.

Gaillard et al., "Effect of plasma and thermal annealing on chemical vapor deposition dielectrics grown using $SIH_4$-$H_2O_2$ gas mixtures", J. Vac. Sci. Technol. A 15(5), Sep./Oct. 1997, pp. 2478-2484.

Taylor et al., "Studies on the reaction between silane and hydrogen peroxide vapour; surface formation of planarized silica layers", J. Chem. Soc., Dalton Trans., 1997, pp. 1049-1053.

Xia et al., "High Aspect Ratio Trench Filling Using Two-Step Subatmospheric Chemical Vapor Deposited Borophosphosilicated Glass for <0.18 μm Device Application", Journal of The Electrochemical Society, 146 (5) 1884-1888 (1999).

Xia et al., "High Temperature Subatmospheric Chemical Vapor Deposited Undoped Silicated Glass—A Solution for Next Generation Shallow Trench Isolation", Journal of The Electrochemical Society, 146 (3) 1181-1185 (1999).

Arno et al., "Fourier Transform Infrared Characterization of Downstream Gas-Phase Species Generated by Tetraethylorthosilicate/Ozone Atmosphere Pressure Reactions", Journal of The Electrochemical Society, 146 (1) 276-280 (1999).

Romet et al., "Modeling of Silicon Dioxide Chemical Vapor Deposition from Tetraethoxysilane and Ozone", Journal of the Electrochemical Society, 148 (2) G82-G90 (2001).

Ikeda et al., "The Effects of Alkoxy Functional Groups on Atomospheric-Pressure Chemical Vapor Deposition Using Alkoxysilane and Ozone", J. Electrochem. Soc., vol. 142, No. 5, May 1995, pp. 1659-1662.

"Customer A low k Gapfill Trikon FlowFill vs FHDP", Novellus Systems, Inc., pp. 1-12.

Ritala et al., "Atomic Layer Deposition", Handbook of Thin Films Materials, vol. 1, 2002, pp. 103-159.

Rulkens et al., "Methods for the Use of Alkoxysilanol Precursors for Vapor Deposition of $SiO_2$ Films", Novellus Systems, Inc., filed Dec. 23, 2004, U.S. Appl. No. 11/021,558, pp. 1-24.

Papasouliotis et al., "Dynamic Rapid Vapor Deposition Process for Conformal Silica Laminates", Novellus Systems, Inc., filed Dec. 30, 2004, U.S. Appl. No. 11/027,480, pp. 1-29.

Papasouliotis et al., "Multi-Step Nanolaminate Dielectric Deposition and Etch Back Gap Fill Process", Novellus Systems, Inc., filed Dec. 30, 2004, U.S. Appl. No. 11/026,563, pp. 1-28.

Rulkens et al., "Chamber and Chamber Surface Materials to Inhibit Deposition and Methods of Making Same", Novellus Systems, Inc., filed Dec. 23, 2004, U.S. Appl. No. 11/027,388, pp. 1-26.

Papasouliotis et al., "Methods for Forming High Density, Conformal, Silica Nanolaminate Films Via Pulsed Deposition Layer In Structures of Confined Geometry", Novellus Systems, Inc., filed Dec. 30, 2004, U.S. Appl. No. 11/026,284, pp. 1-24.

U.S. Office Action mailed Oct. 6, 2005, from U.S. Appl. No. 10/975,028.

Tarafdar et al., "Sequential Deposition/Anneal Film Densification Method", Novellus Systems, Inc., filed Oct. 26, 2004, U.S. Appl. No. 10/975,028, pp. 1-34.

Papasouliotis, George D., "Optimal Operation of Conformal Silica Deposition Reactors", Novellus Systems, Inc., U.S. Appl. No. 11/077,198, filed Mar. 9, 2005, pp. 1-32.

Papasouliotis, George D., "Optimal Operation of Conformal Silica Deposition Reactors", Novellus Systems, Inc., U.S. Appl. No. 11/077,108, filed Mar. 9, 2005, pp. 1-31.

U.S. Office Action mailed Nov. 10, 2005, from U.S. Appl. No. 11/021,558.

Tanikella, et al., "Rapid Curing of Positive Tone Photosensitive Polybenzoxazole Based Dielectric Resin by Variable Frequency Microwave Processing", pp. 1-25.

Tanikella, et al., "Variable Frequency Microwave Curing of Benzocyclobutene", pp. 1-32.

Hubbard, et al., "Low Temperature Curing of Polyimide Wafer Coatings", Abstract, Submitted to the "*Advances In Wafer Level And Chip Scale Packaging*" session; STS: IEMT, SEMICON West 2004, 1 page.

Hubbard, et al., "Low Temperature Curing of Polyimide Wafer Coatings" 3 pages.

U.S. Office Action mailed Dec. 30, 2005, from U.S. Appl. No. 11/026,284.

U.S. Office Action mailed Dec. 7, 2005, from U.S. Appl. No. 10/874,808.

U.S. Office Action mailed Dec. 22, 2005, from U.S. Appl. No. 11/026,563.

Papasouliotis et al., "Metal-Free Catalysts for Pulsed Deposition Layer Process for Conformal Silica Laminates", Novellus Systems, Inc., U.S. Appl. No. 11/318,268, filed Dec. 23, 2005, pp. 1-30.

Cho et al., "Localized Energy Pulse Rapid Thermal Anneal Dielectric Film Densification Method", Novellus Systems, Inc., U.S. Appl. No. 11/327,668, filed Jan. 5, 2006, pp. 1-28.

Papasouliotis et al., "Reactive Seam Healing Methods for Improving Film Integrity In Structures of Confined Geometry", Novellus Systems, Inc., U.S. Appl. No. 11/334,762, filed Jan. 17, 2006, pp. 1-24.

U.S. Office Action mailed Dec. 5, 2005, from U.S. Appl. No. 10/746,274.

Cho et al., "Mehtod for Porogen Removal and Mechanical Strength Enhancement of Low-K Carbon Doped Silicon Oxide Using Low Thermal Budget Microwave Curing", U.S. Appl. No. 11/280,113, filed Nov. 15, 2005.

U.S. Office Action mailed Jun. 27, 2008, from U.S. Appl. No. 11/280,113.

U.S. Office Action mailed Jul. 7, 2006, from U.S. Appl. No. 10/875,158.

U.S. Office Action mailed Sep. 27, 2006, from U.S. Appl. No. 11/021,558.

U.S. Office Action mailed Sep. 27, 2006, from U.S. Appl. No. 11/026,284.

U.S. Office Action mailed Sep. 29, 2006, from U.S. Appl. No. 11/027,480.

U.S. Office Action mailed Jan. 16, 2007, from U.S. Appl. No. 10/874,696.

U.S. Office Action mailed Mar. 21, 2007, from U.S. Appl. No. 11/414,459.

U.S. Office Action mailed Apr. 13, 2007, from U.S. Appl. No. 11/026,284.

U.S. Office Action mailed Jul. 7, 2006, from U.S. Appl. No. 10/875,158.

U.S. Office Action mailed Mar. 23, 2007, from U.S. Appl. No. 11/021,558.

Papasouliotis et al., "Pulsed Deposition Layer Gap Fill With Expansion Material," Novellus Systems, Inc., U.S. Appl. No. 11/414,459, filed Apr. 28, 2006, pp. 1-28. [NOVLP165/NVLS-3167].

Papasouliotis et al., "Conformal Nanolaminate Dielectric Deposition and Etch Back Gap Fill Process and Apparatus," Novellus Systems, Inc., U.S. Appl. No. 11/524,502, filed Sep. 19, 2006, pp. 1-38. [NOVLP170/NVLS-3198].

* cited by examiner

HYDROXYL BOND REMOVAL AND FILM DENSIFICATION METHOD FOR OXIDE FILMS USING MICROWAVE POST TREATMENT

FIELD OF THE INVENTION

This invention pertains to methods for forming high density dielectric films. More specifically, the invention pertains to methods of treating deposited dielectric films with microwave radiation.

BACKGROUND OF THE INVENTION

Layers of dielectric film are used in several applications in sub-micron integrated circuit (IC) fabrication. Four such applications are shallow trench isolation (STI), premetal dielectric (PMD), inter-metal dielectric (IMD) and interlayer dielectric (ILD). All four of these layers require silicon dioxide films that fill features of various sizes and have uniform film thicknesses across the wafer.

Chemical vapor deposition (CVD) has traditionally been the method of choice for depositing conformal silicon dioxide films. However, as design rules continue to shrink, the aspect ratios (depth to width) of features increase, and traditional CVD techniques can no longer provide adequately conformal films in these high aspect ratio features.

Two alternatives to CVD are atomic layer deposition (ALD) and pulsed deposition layer (PDL). ALD methods involve self-limiting adsorption of reactant gases and can provide thin, conformal dielectric films within high aspect ratio features. ALD methods have been developed for the deposition of silicon oxide film. An ALD-based dielectric deposition technique typically involves adsorbing a metal containing precursor onto the substrate surface, then, in a second procedure, introducing a silicon oxide precursor gas. The silicon oxide precursor gas reacts with the adsorbed metal precursor to form a thin film of metal-doped silicon oxide. Films produced by ALD are very thin (i.e., about one monolayer); therefore, numerous ALD cycles must be repeated to adequately fill a gap feature.

PDL processing (also known as rapid vapor deposition (RVD) processing) is similar to ALD in that reactant gases are introduced alternately over the substrate surface, but in PDL the silicon oxide film can grow more thickly. Thus, PDL methods allow for rapid film growth similar to using CVD methods but with the film conformality of ALD methods.

While ALD and PDL are useful to form conformal films, conventional ALD and PDL processes are apt to result in areas of low density forming in the films. The conformal nature of ALD and PDL processes means that the aspect ratios of the gaps increase with successive cycles. Diffusion limitations prevent precursor materials from reaching the bottom of these high aspect ratio gaps. Hence, the top of a gap may fill with silicon oxide more quickly than the bottom, preventing further diffusion of the precursor materials into the gap. As a result, areas of low density form. These areas can expand and become voids and seams in subsequent processing steps. Voids and seams ultimately may cause device failure.

Currently, thermal annealing processes are used to increase film density after the film is deposited. While these processes increase density, the temperatures used (around 700° C.) are unsuitably high for many applications. For example, PMD applications often require substrate temperatures of less than 400° C.

What is therefore needed are improved methods for forming conformal films with increased density, particularly for applications requiring low thermal budgets.

SUMMARY OF THE INVENTION

The present invention meets these needs by providing methods of forming dielectric films with increased density and improved film properties with low thermal budget. The methods involve exposing dielectric films to microwave radiation. According to various embodiments, the methods may be used to remove hydroxyl bonds, increase film density, reduce or eliminate seams and voids, and optimize film properties such as dielectric constant, refractive index and stress for particular applications. In certain embodiments, the methods are used to form conformal films deposited by a technique such as PDL. The methods may be used in applications requiring low thermal budgets.

One aspect of the invention relates to a method of filling a gap on a semiconductor substrate. The method involves providing a semiconductor substrate having a gap in a deposition reaction chamber; exposing the substrate surface to a metal-containing precursor gas to form a saturated layer of metal-containing precursor on the substrate surface; exposing the substrate surface to a silicon-containing precursor gas to form dielectric material in the gap; and exposing the dielectric material to microwave radiation.

According to various embodiments, exposure to the microwave radiation may increase the density of the material, reduce number of hydroxyl bonds, reduce the dielectric constant and/or increase the tensile stress of the film.

Another aspect of the invention relates to method of preparing a dielectric film on a substrate. The method involves depositing a dielectric material containing hydroxyl bonds on a substrate, and exposing the dielectric material to microwave radiation to reduce the number of hydroxyl bonds.

A further aspect of the invention relates to a method of preparing a dielectric film on a substrate. The method involves depositing a dielectric material on a substrate; and exposing the dielectric material to microwave radiation to increase the tensile stress of the film.

According to various embodiments, exposure to microwave radiation in the above methods may be used for applications that require low thermal budgets. For example, in certain embodiments, substrate temperatures during exposure to microwave radiation may be below about 500° C., 400° C. or 300° C.

These and other aspects and advantages of the invention are described further below and with reference to the drawings.

DETAILED DESCRIPTION OF THE INVENTION

Figure 1A:
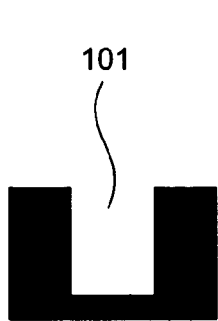
FIGS. 1A-1C are schematic cross-sectional diagrams illustrating seam/void formation during deposition of a conformal film in a trench by a conformal film deposition technique.

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

As indicated, one aspect of the present invention provides methods of forming dielectric films with increased density by exposing deposited films to microwave radiation. In specific embodiments, the methods may be used with conformal film deposition techniques such as PDL and ALD, for example, in gap-fill applications. However, the invention is not limited to films deposited by these techniques but may also be used to increase density of any dielectric film, including silicon oxide film having hydroxyl bonds, e.g., in silanol groups. Other aspects of the invention, such as increasing the tensile stress of the film, may also be extended to dielectric films deposited by any method.

Filling structures such as trenches with doped or undoped silica glass is required for shallow trench isolation (STI), premetal dielectric (PMD), inter-metal dielectric (IMD) and interlayer dielectric (ILD) applications. Two methods that are used for conformal gap-fill are PDL and ALD.

Generally, a PDL method involves sequentially depositing a plurality of atomic-scale films on a substrate surface by sequentially exposing and removing reactants to and from the substrate surface. First, a metal-containing precursor gas is injected into a chamber and the molecules of the gas are chemically or physically adsorbed to the surface of a substrate, thereby forming a "saturated layer" of the metal-containing precursor. Typically, the remaining gas in the chamber is then purged using an inert gas. Thereafter, a silicon-containing precursor gas is injected so that it comes in contact with the adsorbed layer of the metal-containing precursor and reacts to form a reaction product. Because the saturated layer of the metal-containing precursor is nominally thin and evenly distributed over the substrate surface, excellent film step coverage can be obtained. The substrate is exposed to a silicon-containing precursor for a period of time sufficient for silica film to grow to thickness in excess of one monolayer. Further cycles of substrate exposure to the metal-containing precursor, followed by exposure to the silicon-containing precursor, can be implemented and repeated as needed for multiple layers of material to be deposited.

Another deposition technique related to PDL is ALD. PDL and ALD are both surface-controlled reactions involving alternately directing the reactants over a substrate surface. Conventional ALD, however, depends on self-limiting typically monolayer producing reactions for both reactant gases. As an example, after the metal-containing precursor is adsorbed onto the substrate surface to form a saturated layer, the silicon-containing precursor is introduced and reacts only with the adsorbed metal-containing precursor. In this manner, a very thin and conformal film can be deposited. In PDL, as previously described, after the metal-containing precursor is adsorbed onto the substrate surface, the silicon-containing precursor reacts with the adsorbed metal-containing precursor and is further able to react to accumulate a self-limiting, but much thicker than one monolayer film. Thus, as stated previously, the PDL process allows for rapid film growth similar to using CVD methods but with the conformality of ALD type methods.

The differences between conventional ALD and PDL film formation are principally due to the difference between the thicknesses of the films formed after the completion of each type of process and arise from the nature of the metal-containing species used in the initial layer. In ALD, a single exposure to the metal-containing precursor leads to the formation of a monolayer of the product film (generally less than 5 Å thick), while in PDL, the metal-containing precursor catalyzes formation of more than a monolayer of silica film. The typical growth is greater than 150 Å/cycle. Many of the critical features of the above-mentioned applications can be filled in 3-4 PDL cycles. Typically, a silica PDL process utilizes trimethylaluminum (TMA) as the process aluminum precursor.

Films deposited by typical PDL precursors contain a large number of hydroxyl groups. Films deposited by ALD and thermal, sub-atmospheric CVD processes also have a large number of hydroxyl groups. It is necessary to remove these groups in order to increase the density and strengthen the material. In addition, as deposited, the films also have high dielectric constants, e.g., around 7. Removing the hydroxyl groups is also necessary to lower the dielectric constant as required for many device applications.

The present invention will now be described in detail, primarily with reference to PDL processes for the deposition component of the gap fill process. It should be understood that ALD processes may also be used for gap fill in accordance with the invention. Relevant details of ALD processes in general are described in M. Ritala and M. Leskela, "Atomic layer deposition", Chapter 2, Handbook of thin film materials, vol. 1, "Deposition and processing of thin films", Hari Singh Nalwa, Ed. (Academic Press, 2002). Given these details and the description provided herein, one of skill in the art would be able to implement the ALD aspect of the invention.

Further, as indicated above, the microwave annealing aspect of the invention is generally applicable to any doped or undoped dielectric (silicon oxide and silicon nitride) films, regardless of deposition method. For example, hydroxyl group removal by microwave annealing as described below may be applied to any dielectric containing them. Increasing film stress by microwave annealing as described below may be applied to any doped or undoped dielectric silicon oxide or silicon nitride films. The methods are particularly appropriate for processes that require low thermal budgets (i.e., substrate temperatures below about 400° C., or in some embodiments, below about 300° C.).

Figure 1B:
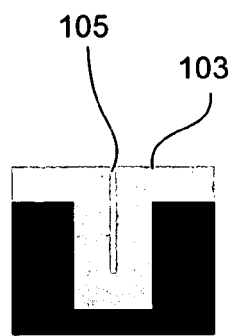
Figure 1C:
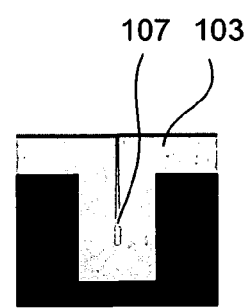

The polymeric film deposited by the PDL process described above requires densification in order for its properties to match those of silicon oxide (USG) and to be successfully integrated into functioning devices. Moreover, the conformal nature of the process may result in the formation of seams, which can expand into voids during subsequent processing. One manner in which this occurs is illustrated in FIGS. 1A-1C. FIGS. 1A-1C are schematic cross-sectional diagrams illustrating seam/void formation during deposition of a conformal film in a trench by a conventional conformal film deposition technique. FIG. 1A shows trench 101 prior to being filled. To fill the trench, dielectric film is deposited conforming to the walls of the trench by a conformal film deposition technique such as PDL. Layers of film fill the trench. FIG. 1B shows the trench after multiple PDL cycles. As the dielectric film 103 fills the trench and the fronts of film conforming to each side advance toward each other, the trench width 105 becomes increasingly narrow. As the trench width narrows, reactants require more time to diffuse to the bottom of the trench. The diffusion limitation slows the rate of reaction at the bottom of the trench, causing the dielectric film to form more quickly near the top of the trench. This causes an area of low density at the bottom of the trench. FIG. 1C shows the trench after the last PDL cycle. A void 107 widening toward the bottom of the trench has formed.

According to certain embodiments, the present invention provides methods to anneal dielectric films, increasing the film density and reducing or eliminating seams and voids. The methods involve exposing the films to microwave radiation. Without being bound by a particular theory, it is believed that the microwave radiation results in raising the internal heat of the film (i.e., heating at the molecular level) by causing oscillations of local molecular polarized dipoles. This causes O—H bonds to break, reducing or eliminating silanol (Si—OH) groups in the film. This approach is fundamentally different from traditional thermal anneal approaches where heat is transferred by convection. In addition, unlike thermal annealing processes, low substrate temperatures may be maintained throughout exposure to microwave radiation in accordance low thermal budget requirements of many applications.

Figure 2:
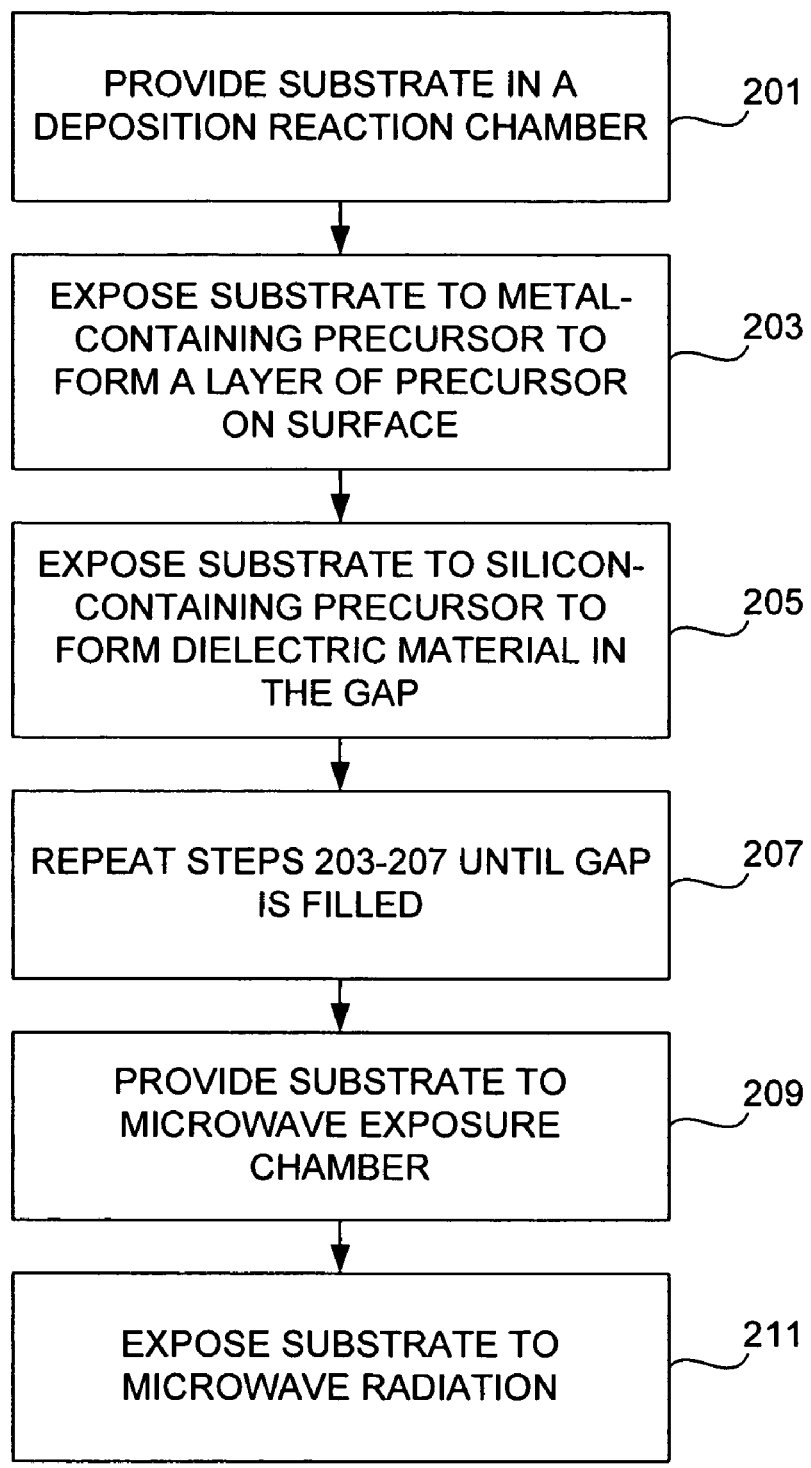
FIG. 2 is a process flowchart depicting the process flow of a method of filling gaps on semiconductor substrate in accordance with one embodiment of the present invention.

FIG. 2 is a process flowchart depicting a process flow of a method of filling gaps on semiconductor substrate in accordance with one embodiment of the present invention. The method (200) involves providing a semiconductor substrate in a deposition reaction chamber (201). For many embodiments of the invention, the substrate is a semiconductor wafer. A "semiconductor wafer" as discussed in this document is a semiconductor substrate at any of the various states of manufacture/fabrication in the production of integrated circuits. As mentioned previously, one commercially important application of the present invention is in various dielectric gap-fill applications such as filling of STI and PMD features. The substrate surface is exposed to a metal-containing precursor gas to form a saturated layer of metal-containing precursor on the substrate surface (203). Examples of metal-containing precursors are aluminum, zirconium, hafnium, gallium, titanium, niobium, or tantalum compounds. In embodiments wherein PDL is employed, the metal-containing precursor may be transition metal precursor, or preferably an aluminum-containing precursor, capable of aiding the catalytic polymerization of the subsequently added silicon-containing precursor to produce a film thicker than a monolayer. In some preferred embodiments, for example, hexakis(dimethylamino)aluminum $(Al_2(N(CH_3)_2)_6)$ or trimethylaluminum $(Al(CH_3)_3)$ are used. Other suitable aluminum-containing precursors include, for example, triethylaluminum $(Al(CH_2CH_3)_3)$ or aluminum trichloride $(AlCl_3)$. Exposure times suitable for forming a saturated layer are typically only seconds. In some embodiments, for example, an exposure time of about 2 seconds is found to be sufficient.

In some embodiments, the temperature of the substrate is optimized during exposure to the metal-containing precursor to achieve high surface coverage by the metal-containing layer and improved gap-fill properties. In preferred embodiments wherein the metal-containing precursor is an aluminum-containing precursor, the temperature of the substrate is between about 150° C. and 250° C. In particularly preferred embodiments, the temperature of the substrate is between about 150° C. and 200° C.

The substrate surface is then exposed to a silicon-containing precursor gas (205). This step may occur in the same or a separate chamber as the step 203. Any suitable silicon-containing precursor that can sufficiently adsorb onto and react with the saturated layer of aluminum-containing precursor to form a dielectric film may be used. In embodiments wherein PDL is employed, the silicon-containing precursor should be capable of polymerization when exposed to the adsorbed aluminum-containing precursor to produce a film thicker than a monolayer. Preferred silicon-containing precursors include silanols and silanediols, such as alkoxysilanols, alkyl alkoxysilanols, alkyl alkoxysilanediols and alkoxysilanediols. Examples of suitable precursors include tris(tert-butoxy)silanol $((C_4H_9O)_3SiOH)$, tris(tert-pentoxy)silanol $((C_5H_{11}O)_3SiOH)$, di(tert-butoxy)silandiol $((C_4H_9O)_2Si(OH)_2)$ and methyl di(tert-pentoxy)silanol.

Other gases may be introduced to the chamber with the silicon-containing precursor gas. Such gases include an oxygen source and/or a hydrolyzing agent. Examples of oxygen sources include $O_2$, $O_3$, $H_2O_2$, $NO_2$, $N_2O_3$, $N_2O_5$ or $HNO_3$. Examples of hydrolyzing agents are compounds containing hydrogen with some protoic character such as $H_2O$ or $H_2O_2$, HF or HCl. Additionally, any dopant gas may be introduced, including phosphorous-, fluorine- and carbon-containing dopant gases. A carrier gas may also be used. Typically the carrier gas is an inert gas.

In some embodiments, the temperature of the substrate is optimized during exposure to the silicon-containing precursor to achieve improved film properties. In certain embodiments wherein the silicon-containing precursor is a silanol, the temperature of the substrate is between about 200° C. and 300° C. Exposure times suitable for reacting with the metal-containing precursor are typically only seconds.

In the embodiment depicted in FIG. 2, steps 203 and 205 are then repeated until the desired amount of film is deposited, for example, until gap is substantially filled (207). After the desired amount of film is deposited, the substrate is provided to a chamber connected to or containing a microwave source and suitable for exposing the substrate to microwave radiation (209). According to various embodiments, the chamber may be the same or a different chamber than the deposition chamber or chambers.

The film is exposed to microwave radiation (211) in a manner that results in the densification and/or improved properties of the film. Typical microwave frequencies range between about 1-4 GHz, with 2.45 GHz used in a particular embodiment. Microwave power typically ranges between about 100 W and 7 kW, and more preferably between 1 kW and 4 kW, for example 3 kW in one embodiment. According to various embodiments, the microwave anneal may increase stress, reduce the dielectric constant and/or eliminate seams and voids.

Microwave exposure times can vary broadly, depending on the application. Typical exposure times to obtain good properties may range from below 5 minutes to several hours. In some embodiments, exposure times of 40-60 minutes are used. Temperature may also range from room temperature to 600 degrees Celsius. Of course, for certain embodiments, lower temperatures are preferred. For example, PMD applications are very temperature sensitive, and so will often require temperatures below about 400° C.

In preferred embodiments, the process of 211 occurs in an inert environment. Such environments may include an inert gas such as nitrogen, helium or argon in the reaction chamber. In some embodiments of the invention, a more reactive ambient comprising a gas such as hydrogen may be used during microwave exposure. A combination of the reactive and inert gases mentioned above may also be used. In preferred embodiments, microwave exposure is performed in a nooxygen ambient, to prevent film oxidation. The pressure during microwave exposure is typically between 1 μTorr and 760 Torr.

Although not shown in FIG. 2, it should be noted that introduction of a purge gas can be used in between operations wherein contact between reactant gases should be avoided, including between each PDL or ALD cycle. Further, the purge gas can be flowed continuously during any of these operations and a period or periods between the operations. Purge gases are generally chemically inert. However, gases potentially reactive with the substrate surface (H2, O2 or steam) may be used for specific embodiments. The reaction chamber may additionally be evacuated following the gas purge step.

Removing Hydroxyl Bonds

Figure 3A:
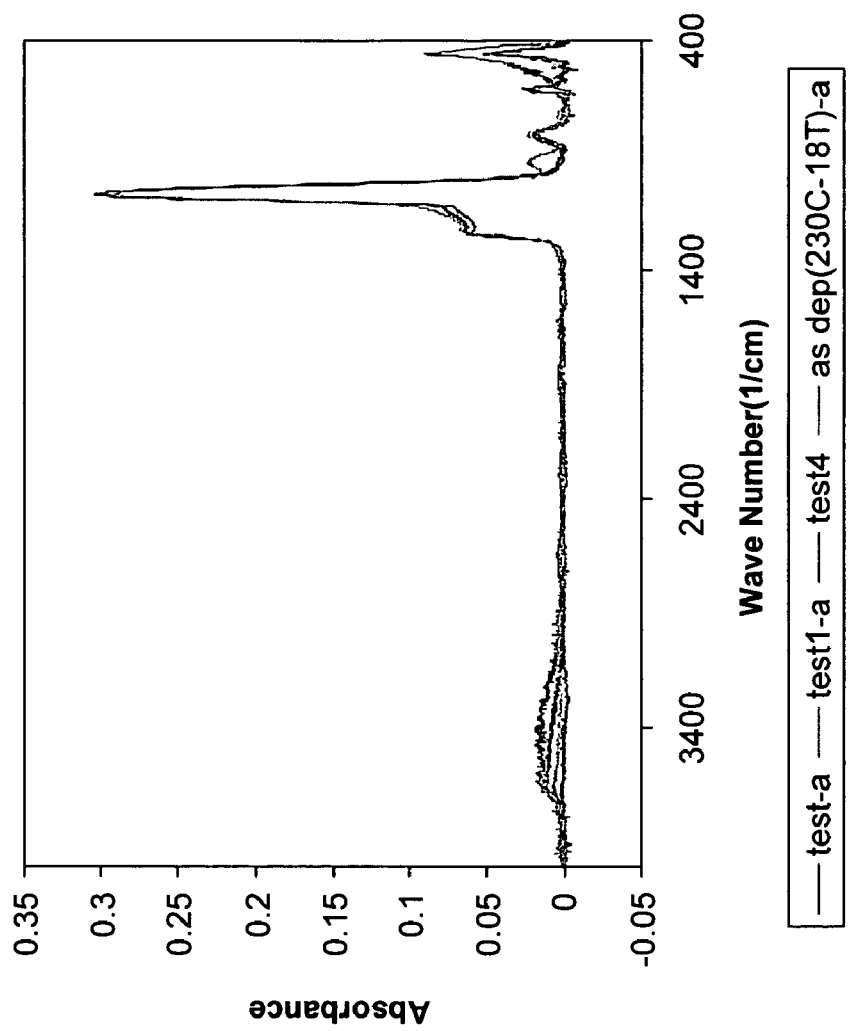
FIG. 3A presents FTIR spectra of a silicon oxide film containing Si—OH bonds pre- and post-exposure to microwave radiation.
Figure 3B:
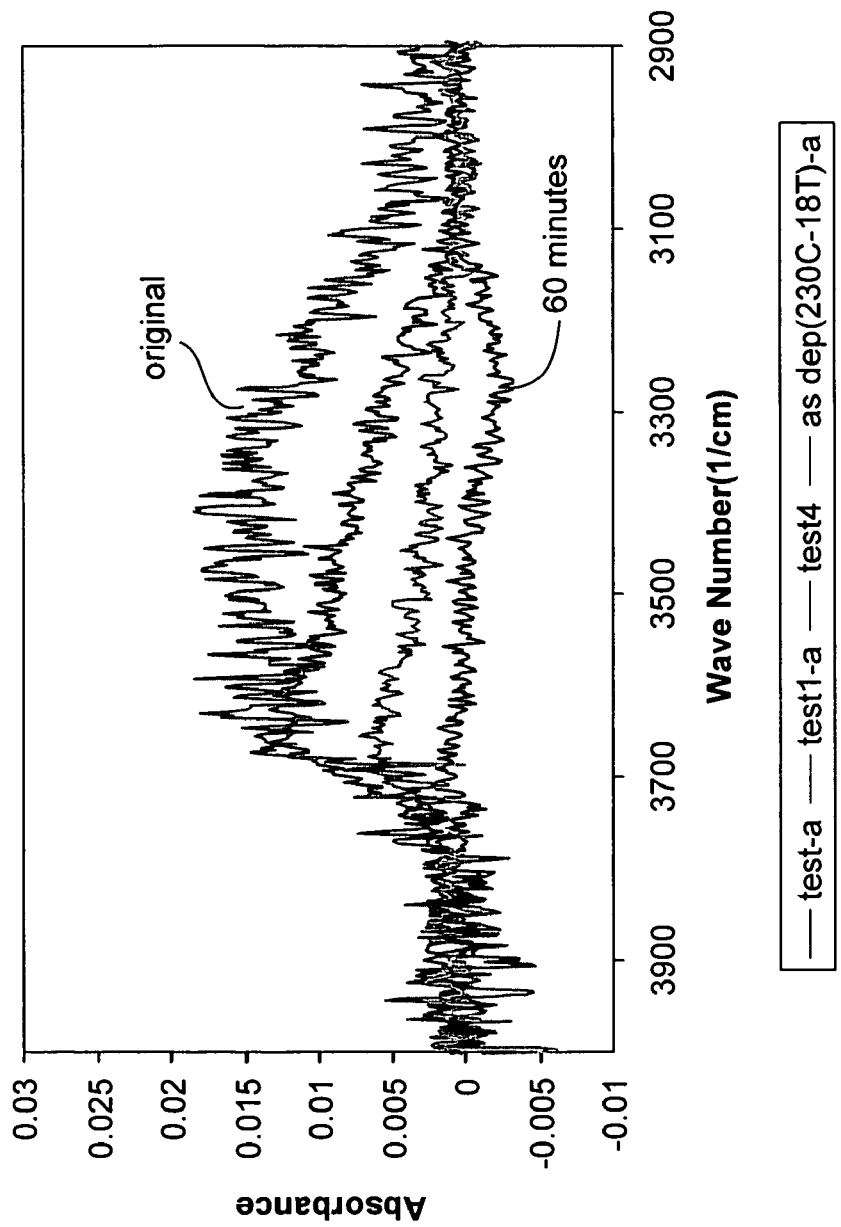
FIG. 3B presents a blown-up view of wavenumbers 2900-4000 l/cm of the spectra shown in FIG. 3A.

As discussed above, PDL films contain many hydroxyl bonds, the removal of which is necessary for increased density and reduction of the dielectric constant. FIG. 3A presents FTIR spectra of a silicon oxide film deposited by PDL, pre- and post-anneal. Reference number 301 indicates the spectrum of a film as deposited, 303 of the film after 5 minutes of exposure to microwave radiation, 305 after 30 minutes of exposure to microwave radiation, and 306 after 60 minutes of exposure. FIG. 3b presents a blown-up view of the wavenumber of the FTIR spectra from 2900 to 4000 l/cm. The presence of hydroxyl bonds in silanol groups is indicated by the absorbance around 3400 l/cm. As can be seen from FIG. 3B, the hydroxyl bonds are completely eliminated after 60 minutes of microwave exposure. Shorter exposure times may be obtained by varying process parameters.

In addition to the complete hydroxyl bond removal shown in FIG. 3a, the microwave annealing lowers the dielectric constant of the deposited film, e.g., from about 7 to about 4 and lowers the refractive index. According to various embodiments, dielectric constants of between about 4.0+/−0.1 are obtained. Refraction indices of between about 1.45+/−0.01 are obtained. Removing hydroxyl bonds also increases the density of the film. According to various embodiments, film shrinkage of 5% is obtained.

Increasing Tensile Stress

In certain embodiments, high tensile stress oxide films are desired. High tensile stress oxide for the applications including STI and PMD gap-fill can reduce the overall stress of the stack during integration, which in turn improves electrical performance.

Figure 4:
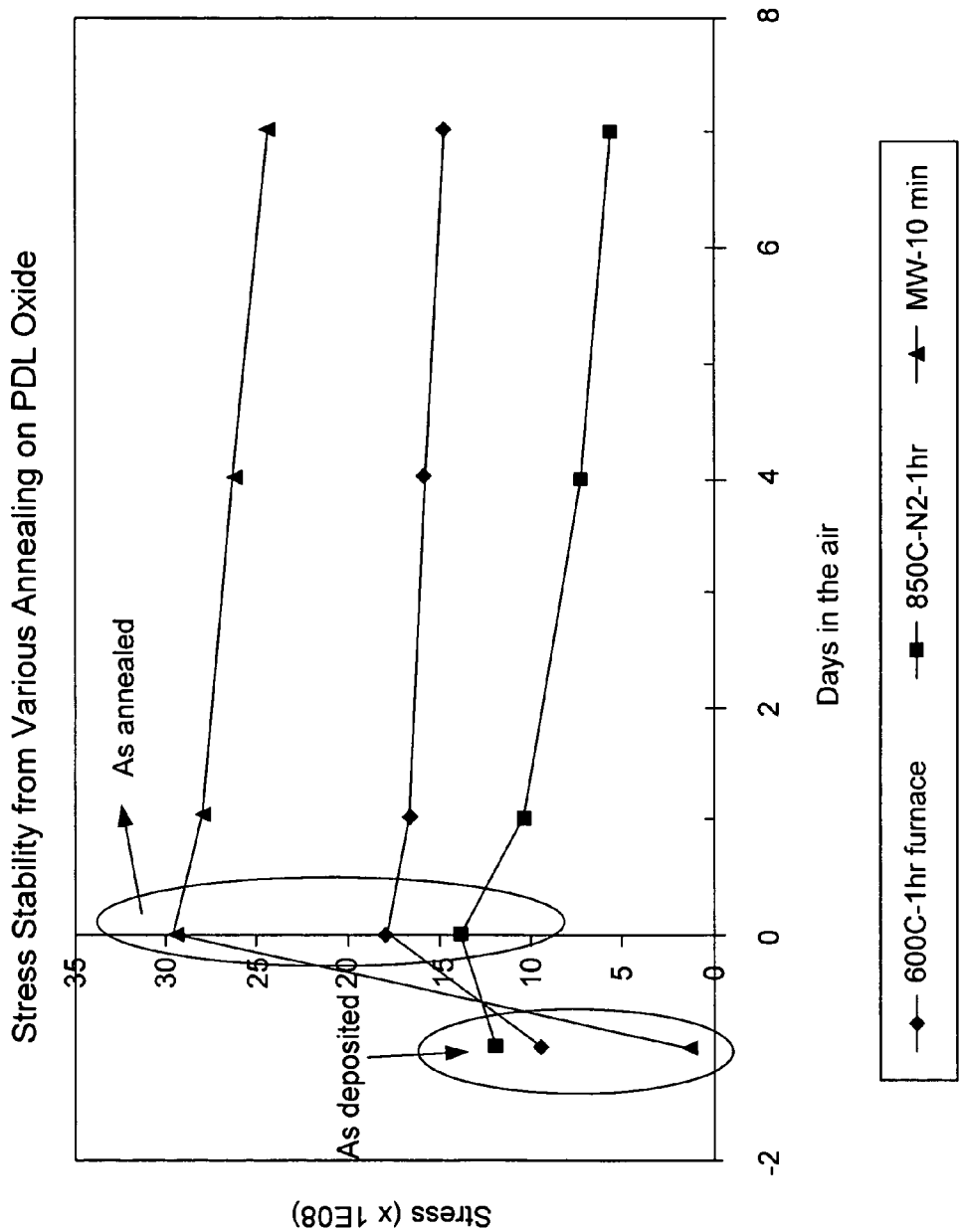
FIG. 4 is a graph comparing the stress and stress stability of a silicon oxide film that has been annealed by exposure to microwave radiation with that of furnace annealed silicon oxide films.

In certain embodiments of the present invention, the microwave annealing step (e.g., step 211 in FIG. 2) may be used to increase tensile stress of the deposited film. FIG. 4 shows stress in dyne/cm2 as a function of time of silicon oxide films subjected to various forms of annealing, specifically annealing in a furnace for 1 hour at 600° C.; annealing in a furnace in the presence of nitrogen for 1 hour at 850° C., and microwave annealing for 10 minutes in air ambient and at atmospheric pressure. Tensile stress is shown of the films as deposited (at time −1 day) and as annealed (at time 0 days), and at 1, 4 and 7 days of exposure to air.

As deposited, stress ranges from about 0–12×10$^8$ dyne/cm2. It can be seen from FIG. 4, that while furnace annealing for one hour increases tensile stress slightly (no more than about 8 MPa), exposure to microwave radiation at 400° C. for 10 minutes results in significant stress increase (from about 1×10$^8$ to about 30×10$^8$ dyne/cm$^2$). Further, the film exposed to microwave radiation exhibits a similar degree of stress stability as the furnace annealed films, that is to say that the tensile stress does not change significantly after prolonged ambient exposure as shown by the relatively flat stress vs. time curve in FIG. 4.

According to various embodiments, tensile stress of oxide films between about 90 MPa -500 MPa may be obtained. For example, in one experiment stress was increased from 90 MPa to 323 MPa after exposure to 1 hour of microwave radiation at 400° C.

Process Parameters

Microwave Radiation

Frequency

It will be appreciated by those skilled in the art that the microwave radiation used with the invention encompasses all microwave frequencies. Methods of the invention utilize microwave radiation for various operations removing hydroxyl bonds, increasing density, reducing seams and voids, lowering the dielectric constant and increasing tensile stress. Some operations may more effectively be implemented using microwave radiation with a particular range of frequencies, i.e., frequency distribution. However, in particular embodiments, for all operations, low frequency microwave radiation, i.e., between 1 and 4 GHz is used.

Frequencies between about 0.3 and 4 GHz, more preferably between about 1 and 4 GHz, and in some embodiments at about 2.45 GHz have been found to work well for all of the stated applications. These lower microwave frequencies have resulted in significantly better OH removal than higher microwave frequencies (e.g. around 7 GHz).

Power and Exposure Time

Microwave power and exposure time are largely functions of each other (with higher power requiring less time), as well as frequency and film density and thickness. Power may range from 100 W -7 kW, with 1-3 KW preferred, and 3 kW used in a particular embodiments. Typical exposure times may range from seconds to tens of hours.

Of course, power should be high enough and exposure time long enough to remove hydroxyl bonds, increase density, lower dielectric constant or increase tensile stress as desired. In specific embodiments, exposure time of about 40 minutes to 1 hour is used with 1200 kW power. In commercial embodiments, it may be desirable to raise microwave power to allow for reduced exposure time.

Temperature

Substrate temperature during microwave radiation exposure typically ranges between about −10 and 600° C. However, as discussed above, the use of microwave radiation allows for lower thermal budgets than thermal annealing since heat is not transferred by convenction. Thus in specific embodiments, the temperature may be below about, for example, 500° C., 400° C., 300° C., 100° C. or room temperature.

Pressure and Ambient Conditions

Pressure typically ranges from 0 to 760 Torr, with atmospheric pressure used in certain embodiments. Microwave exposure may be performed in the presence of gases such as argon, hydrogen, helium, nitrogen, air or mixtures thereof.

Other Process Conditions

The microwave radiation may be applied continuously or pulsed. Also in preferred embodiments the microwave radiation is applied in TE and/or TM mode.

Apparatus

The present invention can be implemented in many different types of apparatus. In preferred embodiments, the apparatus will include one or more chambers (sometimes referred to as process vessels) that house one or more wafers and are suitable for wafer processing. At least one chamber will include a microwave source. A single chamber may be employed for all operations of the invention or separate chambers may be used. Each chamber may house one or more wafers for processing. The one or more chambers maintain the wafer in a defined position or positions (with or without motion within that position, e.g. rotation, vibration, or other agitation) during procedures of the invention. For certain operations in which the wafer temperature is to be controlled, the apparatus may include a heating or cooling platen. Any suitable deposition chamber may be used in embodiments that include deposition of the dielectric film. Examples of suitable conformal deposition apparatuses are described in U.S. patent application Ser. No. 11/026,284, hereby incorporated by reference in its entirety. In a preferred embodiment, the microwave chamber is capable of processing multiple wafers simultaneously.

Figure 5:
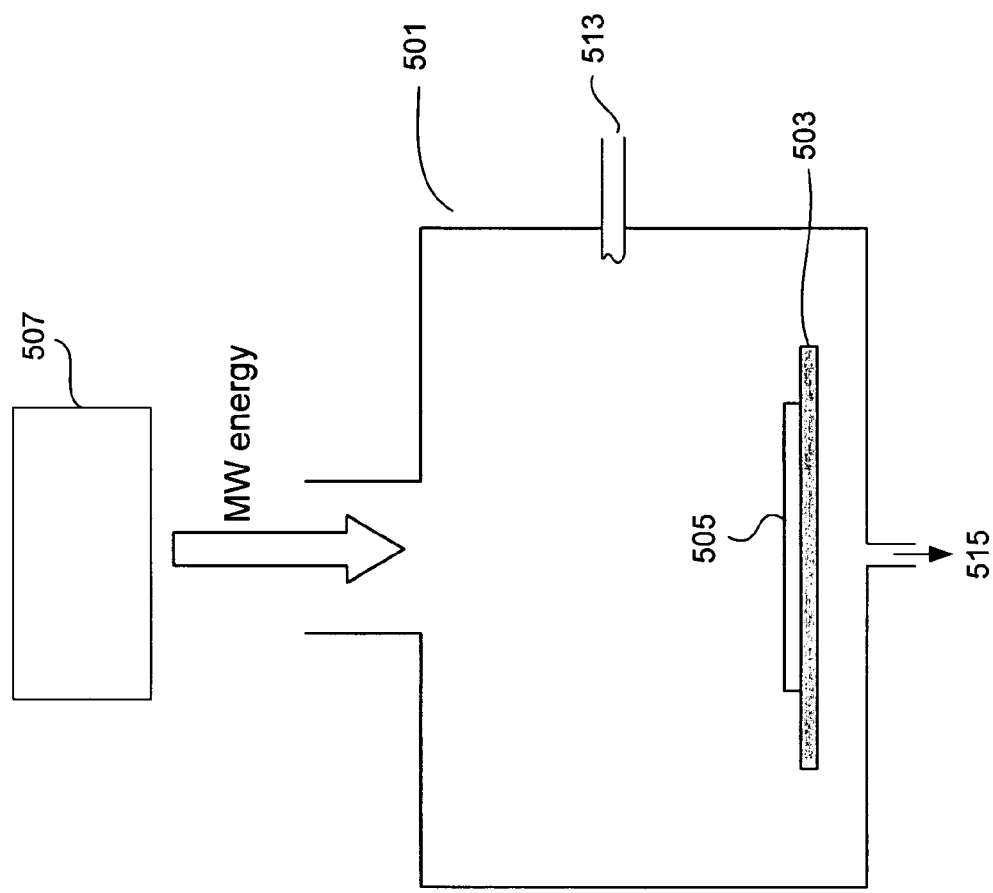
FIG. 5 is a block diagram depicting various reactor components arranged for implementing the deposition of dielectric films in the present invention.

FIG. 5 is a simplified schematic diagram of an example of a microwave exposure chamber 501 in accordance with the invention. Chamber 501 is capable of holding a vacuum and/or containing gases at pressures above atmospheric pressure. For simplicity, only one chamber 501 is shown. It is noted that in preferred embodiments, chamber 501 is one chamber in a multi-chambered apparatus (entire apparatus not shown), although chamber 501 could alternatively be part of a stand-alone single chambered apparatus.

Wafer 505 rests on rotating quartz table 503 in a position such that radiation from a microwave source can irradiate wafer 505. Wafer 505 may also be in contact with a heater (not shown) that can heat the wafer to defined temperatures, or a chiller to cool the wafer. Chamber 501 is configured with a gas inlet 515, which is connected to a gas source (not shown), and with a vacuum outlet 513, which is connected to a vacuum pump (not shown). The amount of gas introduced into chamber 501 can be controlled by valves and mass flow controller (not shown) and pressure is measured by pressure gauge (not shown).

In this example, microwave source 507 is mounted outside the chamber 501. In alternate embodiments, the microwave may be housed inside chamber 501. Note that this is only an example of a suitable configuration. In general, it is preferable that the microwave source or sources are arranged to provide uniform microwave radiation to the wafer. In some embodiments, microwave radiation is applied directly on the wafer. In others, a remote microwave source can be mounted on chamber 501.

In a preferred embodiment, a remote microwave source is used to ionize the gases fed into the chamber, and, in addition, the substrate is irradiated by a second source mounted on the microwave chamber.

During normal operation, chamber 501 is first evacuated via vacuum outlet 513, and then the inert gas (e.g., argon, nitrogen) is introduced via gas inlet 513 to a certain chamber pressure or the chamber is left under vacuum. Next, microwave source 507 is turned on to provide uniform microwave radiation of an appropriate frequency to remove hydroxyl bond in the material and leave a dielectric layer on wafer 505. Chamber 501 is under pressure $\leq 1$ atm to remove volatilized residues or under continuous purge to remove any of the gases evolving during microwave exposure. Inert gas is again introduced via gas inlet 513 or the chamber is left under vacuum. Next, the microwave source is turned or left on to mechanically strengthen the dielectric layer on wafer 505. Typically, wafer 505 is then removed from chamber 501.

Note that the apparatus depicted in FIG. 5 is only an example of a suitable apparatus and other designs for other methods involved in previous and/or subsequent processes may be used. For example, methods of the invention may be used with a standard deposition chamber used to deposit the dielectric layer if the chamber is equipped with a microwave radiation source.

EXPERIMENTAL

The following example provides details illustrating aspects of the present invention. This example is provided to exemplify and more clearly illustrate these aspects of the invention and is in no way intended to be limiting.

Example 1

Dielectric film was deposited on a wafer by a pulsed deposition layer process using trimethylaluminum and tris(tert-pentoxy)silanol as the metal-containing and silicon-containing precursor gases, respectively. The deposited film was then exposed to microwave radiation at 2.45 GHz and 1200 W at atmospheric pressure. The overall substrate temperature did not exceed 400° C. during the microwave exposure. FTIR spectra of the film as deposited, and after 5 min and 60 minutes is shown in FIGS. 3A and 3B, and discussed above. As noted above, the hydroxyl bonds on the Si—OH groups were completely eliminated by 60 minutes of exposure. In addition, the dielectric constant was lowered from 7.0 to 4.0—indicating that the film was completely cured. Refraction index was lowered from 1.457 to 1.445. Film shrinkage was 5.0%.

Dielectric film was deposited on a wafer in the same manner as above, and subjected to thermal anneal at 400° C. until the peak at 3400 l/cm was reduced (indicating hydroxyl bond removal). Even after 5 hours of film curing in a convection furnace (at 400 C, under atmospheric pressure, and in air), the dielectric constant was 5, indicating that the film was not completely cured.

Example 2

Dielectric film was deposited on a wafer in the same manner as described in Example 1. The tensile stress of the deposited was measured as 93 MPa. The deposited film was then exposed to microwave radiation at 2.45 GHz and 1200 W at atmospheric pressure and air ambient for 40 minutes. Substrate temperature was less than or equal to 400° C. Tensile stress was 323 MPa after annealing.

Dielectric film was deposited on a wafer as described above. The wafer was then thermally annealed at 600° C. for 1 hour. After annealing the tensile stress was measured at 125 MPa—significantly lower than that achieved by microwave annealing.

Other Embodiments

This method applies to the deposition of silica (USG). However, this method may also be used for depositing doped silica films, such as fluorine-doped silicate glass (FSG), phosphosilicate glass (PSG), boro-phospho-silicate glass (BPSG), or carbon doped low-k materials.

Other deposition co-reactants, such as silanols with varying substituents (e.g., more than one kind of alkoxy substituent) may be used to improve the film characteristics. For an example, see U.S. patent application Ser. No. 10/874,814, filed Jun. 22, 2004, titled "Mixed Alkoxy Precursors and Methods of Their Use for Rapid Vapor Deposition of $SiO_2$ Films." Furthermore, the properties of the dielectric film may be improved by other means as well, including by using an aluminum oxide nucleation layer formed by ALD prior to the application of the silica layer. See, for example, U.S. patent application Ser. No. 10/875,158, filed Jun. 22, 2004, titled "Silica Thin Films Produced By Rapid Surface Catalyzed Vapor Deposition (RVD) Using a Nucleation Layer." Note also that this technique may be used in combination with a phosphorous getterer as described in U.S. patent application Ser. No. 10/874,808, filed Jun. 22, 2004, titled "Aluminum Phosphate Incorporation In Silica Thin Films Produced By Rapid Surface Catalyzed Vapor Deposition (RVD)." The above-referenced applications are incorporated by reference in their entirety for all purposes.

Further, as discussed above, microwave annealing may be applied to any dielectric film, regardless of deposition method. In particular, microwave annealing to increase tensile stress may be applied to any doped or undoped silicon oxide or silicon nitride film.

While this invention has been described in terms of several embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention. The use of the singular in the claims does not mean "only one," but rather "one or more," unless otherwise stated in the claims.

What is claimed is:

1. A method of depositing a dielectric film in a gap on a semiconductor substrate, the method comprising:
    a) providing a semiconductor substrate in a deposition reaction chamber;
    b) exposing a substrate surface of the semiconductor substrate to a metal-containing precursor gas to form a saturated layer of metal-containing precursor on the substrate surface;
    c) exposing the substrate surface to a silicon-containing precursor gas to form dielectric material in the gap; and
    d) exposing the dielectric material to microwave radiation to modify properties of the dielectric material.

2. The method of claim 1 wherein step (d) removes hydroxyl bonds from the dielectric material.

3. The method of claim 2 wherein substantially all hydroxyl bonds are removed from the dielectric material.

4. The method of claim 1 wherein step (d) increases tensile stress of the dielectric material.

5. The method of claim 4 wherein the tensile stress is increased to at least about 300 MPa.

6. The method of claim 1 wherein step (d) reduces the dielectric constant of the dielectric material.

7. The method of claim 6 wherein the dielectric constant is reduced to about 4.

8. The method of claim 1 wherein the dielectric material is exposed to the microwave radiation for no more than about 1 hour.

9. The method of claim 1 wherein a substrate temperature is no more than about 400° C. during step (d).

10. The method of claim 9 wherein the substrate temperature is no more than about 300° C. during step (d).

11. The method of claim 1 wherein microwave frequency is between about 0.3 and 4 GHz.

12. The method of claim 1 further comprising, prior to step (d), repeating steps (b) and (c) until a target dielectric film thickness is substantially achieved.

13. The method of claim 1 further comprising, prior to step (d), repeating steps (b) and (c) until the gap is substantially filled with dielectric film.

14. A method of preparing a dielectric film on a substrate, the method comprising:
    a) depositing a dielectric material on a substrate, the dielectric material comprising hydroxyl bonds, wherein depositing the dielectric material on the substrate comprises depositing the dielectric material from a vapor by an atomic layer deposition (ALD) or pulsed deposition layer (PDL) method; and
    b) exposing the dielectric material to microwave radiation to reduce a number of hydroxyl bonds.

15. The method of claim 14 wherein a substrate temperature during step (b) is no more than about 400° C.

16. The method of claim 14 wherein a substrate temperature during step (b) is no more than about 300° C.

17. The method of claim 14 wherein a microwave frequency is between about 0.3 and 4 GHz.

18. The method of claim 14 wherein the step (a) comprises depositing the dielectric material by a thermal, sub-atmospheric pressure CVD method.

19. The method of claim 14 wherein (a) comprises exposing the substrate surface to a metal-containing precursor gas to form a saturated layer of metal-containing precursor on the substrate surface; and exposing the substrate surface to a silicon-containing precursor gas to form dielectric material.

20. The method of claim 14 (a) comprises exposing a gap on the substrate surface to a metal-containing precursor gas to form a saturated layer of metal-containing precursor in the gap; and exposing the substrate surface to a silicon-containing precursor gas to form dielectric material in the gap.

21. The method of claim 14 wherein substantially all hydroxyl bonds are removed from the dielectric material.

22. The method of claim 14 wherein (b) increases tensile stress of the dielectric material.

23. The method of claim 14 wherein (b) reduces a dielectric constant of the material.

24. The method of claim 14 wherein a substrate temperature is no more than about 300° C. during (b).

25. The method of claim 14 wherein microwave frequency is between about 0.3 and 4 GHz.

* * * * *

UNITED STATES PATENT AND TRADEMARK OFFICE
CERTIFICATE OF CORRECTION

PATENT NO.        : 7,589,028 B1                                    Page 1 of 1
APPLICATION NO.   : 11/280076
DATED             : September 15, 2009
INVENTOR(S)       : Cho et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 724 days.

Signed and Sealed this

Twenty-first Day of September, 2010

David J. Kappos
*Director of the United States Patent and Trademark Office*